(12) United States Patent
Maiuzzo (10) Patent No.: US 8,190,964 B2
(45) Date of Patent: May 29, 2012

(54) DECODING METHOD

(75) Inventor: Michael Maiuzzo, Queenstown, MD (US)

(73) Assignee: Sentel Corporation, Alexandria, VA (US)

( * ) Notice: Subject to any disclaimer, the term of this patent is extended or adjusted under 35 U.S.C. 154(b) by 528 days.

(21) Appl. No.: 12/484,401

(22) Filed: Jun. 15, 2009

(65) Prior Publication Data

US 2009/0249170 A1    Oct. 1, 2009

Related U.S. Application Data

(60) Continuation-in-part of application No. 11/473,658, filed on Jun. 23, 2006, now Pat. No. 7,549,106, which is a division of application No. 10/116,132, filed on Apr. 5, 2002, now Pat. No. 7,093,188.

(51) Int. Cl.
*H03M 13/29* (2006.01)

(52) U.S. Cl. ...................................... 714/755; 714/780

(58) Field of Classification Search .................. 714/755, 714/780

See application file for complete search history.

(56) References Cited

U.S. PATENT DOCUMENTS

| | | | | |
|---|---|---|---|---|
| 5,875,199 A * | 2/1999 | Luthi | ............................ | 714/780 |
| 5,912,907 A * | 6/1999 | Stewart | ......................... | 714/774 |
| 5,926,489 A * | 7/1999 | Luthi et al. | .................... | 375/346 |
| 5,996,103 A * | 11/1999 | Jahanghir | ....................... | 714/755 |
| 7,545,890 B1 * | 6/2009 | Shalvi et al. | .................. | 375/341 |
| 7,603,591 B2 * | 10/2009 | Chiou | ........................... | 714/704 |

\* cited by examiner

*Primary Examiner* — Stephen Baker
(74) *Attorney, Agent, or Firm* — The Marbury Law Group, PLLC (57) ABSTRACT

A method for decoding forward error correction (FEC) encoded data. A stream of units of FEC encoded bits are received, where the units are derived from a transmitted signal, where each unit represents a one-bit data value, and where each unit includes correctness bits. Preferably, the stream of units of FEC encoded bits are decoded by using the quality level of bits to perform soft-decision convolution decoding on the stream of units of FEC bits, where the soft-decision convolution decoding produces, for block decoding, a stream of symbols made up of bits. Subsequences of units that are prone to erroneous soft-decision convolution decoding are detected by determining, for the sub-sequences whether the distribution of quality bits indicate the units are below a threshold level of correctness, and by comparing characteristics of that distribution to a given set of characteristics predetermined to be prone to result in incorrect decoding.

15 Claims, 11 Drawing Sheets

DECODING METHOD

RELATED APPLICATIONS

This application is a continuation-in-part of divisional application 11/473,658, filed Jun. 23, 2006 now U.S. Pat. No. 7,549,106, which is a divisional Application of U.S. Utility Application Ser. No. 10/116,132, filed Apr. 5, 2002, now U.S. Pat. No. 7,093,188. The Ser. No. 11/473,658 and Ser. No. 10/116,132 applications are incorporated herein by reference for all purposes.

BACKGROUND

Forward Error Correction (FEC) is a common method of achieving data transmission with low error rates. FEC coding techniques transmit data in encoded form by encoding the data with added redundancy or parity data, which is used by a decoding device to detect and correct errors introduced during transmission or passage of the data between a source and a destination. Generally, data does not have to be retransmitted to correct errors.

The ability of FEC systems to correct errors without retransmission makes them suitable for use in satellite communications systems. Many satellite communications systems use a conventional form of FEC coding; concatenated Viterbi and Reed Solomon coding. Convolutional encoding with Viterbi decoding is capable of correcting disperse, scattered errors, as caused, for example, by white noise. Reed Solomon (block) coding is capable of correcting limited-size burst errors, as caused, for example, by pulsed noise. In combination, concatenated convolutional and Reed Solomon coding improve system performance in the presence of pulse and scattered interference. Nevertheless, communications systems using such coding that are near multiple or high duty cycle radars often suffer from performance degradation. There is a need for a mitigation technique that allows FEC coding systems to compensate for pulse error patterns, as for example, are typically introduced by multiple interfering and/or high duty cycle radars.

SUMMARY

Embodiments herein are directed to a method and apparatus for decoding data that has been encoded by conventional concatenated block and convolutional encoding. The method and apparatus provide improved system performance in the presence of pulsed and continuous interference. Error correction of conventionally encoded data is improved, and the overhead rate (number of code/parity bits) is not increased.

The above aspects may be attained by a system that identifies a portion of data with a probability of being erroneously decoded by a convolutional decoder, that decodes the data with the convolutional decoder, and that further decodes the data with a second decoder by taking into account that the data has a portion that has been identified to have a probability of having been erroneously decoded by the convolutional decoder. The further decoding may be performed by a blocked decoder, and the convolutional decoder and the blocked decoder perform soft-decision decoding according to quality information derived from the quality of a signal from which decoded data has been obtained. The soft-decision convolution decoding may be carried out with soft-decision Viterbi decoding, and the block decoding may be carried out with Reed Solomon decoding. The above aspects may also be carried out by identifying or detecting a portion of data with a probability of being erroneously decoded by a convolutional decoder; decoding the data with the convolutional decoder; and further decoding the data with a second decoder by taking into account that the data has a portion that has been detected or identified to have a probability of having been erroneously decoded by the convolutional decoder.

DETAILED DESCRIPTION

Figure 1:
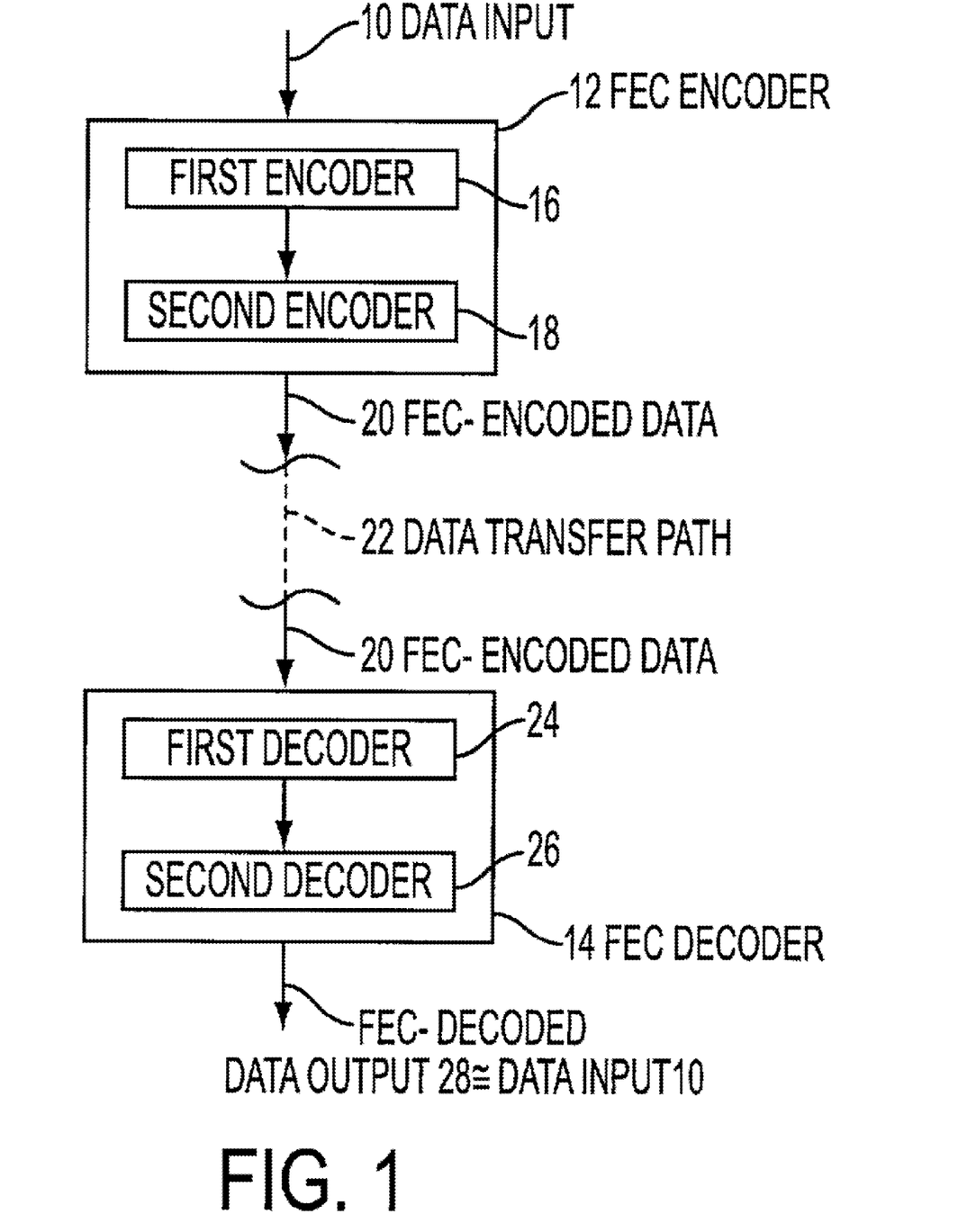
FIG. 1 illustrates a conventional Forward Error Correction (FEC) coding system.

Before discussing the invention in detail, the operation of a conventional system will be described. FIG. 1 illustrates a conventional Forward Error Correction (FEC) coding system. Data input 10 is passed to an FEC encoder 12. The FEC encoder 12 includes a first encoder 16, and a second encoder 18. The first encoder 16 and the second encoder 18 perform concatenated linear FEC encoding. The first encoder 16, sometimes called the outside encoder, is typically a block encoder. The data input 10 is block encoded by the first encoder 16, whose output is passed to the second encoder 18. The second encoder 18, sometimes referred to as the inner encoder, typically performs convolutional encoding of the data output by the first encoder 16. The convolutionally and block encoded data 20 is output by the FEC encoder 12.

The FEC encoded data 20 is transferred across a data transfer path 22. The data transfer path 22 is typically a radio transmission link, a data network path, a databus, etc. Noise is typically introduced in the data transfer path, which makes reception of the correct data difficult. A storage device, such as a digital optical storage disk, may also be used as a data transfer path 22. In such a case, FEC encoded data 20 is stored on the disk, and is read from device and passed to an FEC decoder 14.

The FEC decoder 14 is equipped with a first decoder 24 and a second decoder 26. The first decoder 24, often referred to as the inner decoder, decodes the FEC encoded data 20 with a decoding process corresponding to the encoding performed by the second encoder 18. Output of the first decoder 24 is processed by the second decoder 26, also known as the exterior decoder. The second decoder 26 performs a decoding process corresponding to the encoding performed by the first encoder 16. The resulting FEC decoded data output 28 is approximately equal to the data input 10, where effects of noise added to the FEC encoded data 20 introduced during transfer across the data transfer path 22 are mitigated by either the first decoder 24 or the second decoder 26. Perfect error correction is not generally guaranteed, and some bits in the decoded data output 28 may not equal their counterparts in the data input 10.

Figure 2:
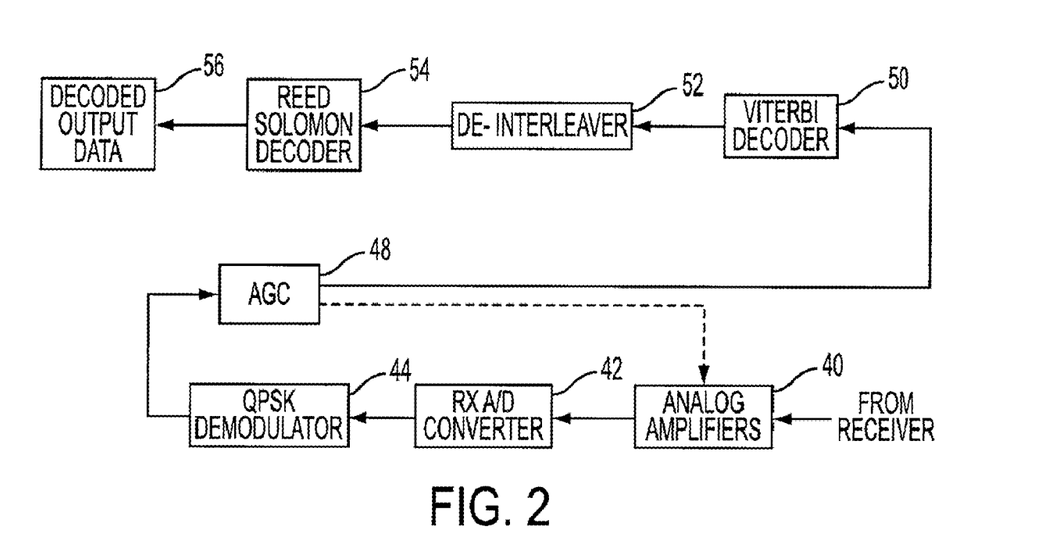
FIG. 2 illustrates a detailed version of a conventional FEC decoder 14.

FIG. 2 illustrates a detailed version of a conventional FEC decoder 14. Analog amplifiers 40 amplify a received analog signal. The amplified signal is fed to a rectifying analog digital converter 42. The AGC circuit 48 maintains the amplifier level so as to not overdrive the converter. The converter 42 derives from the amplified signal digital data, which is passed to a quadrature phase shift keyed (QPSK) demodulator 44. The QPSK demodulator 44 uses variations in 90 degree phase shift intervals in the amplified digital signal to weight or rank the quality of a bit corresponding to a given 90 degree interval. The QPSK demodulator 44 outputs three bits for each one-bit data value, where the three bits indicate whether the data value is 0 or 1, and also indicate the level of correctness of the 0 or 1 value. There are eight possible levels of correctness or quality, for example, zero through seven. A level of zero would indicate a high level of correctness that a binary zero was sent and at the same time a very low level of correctness that a binary one was sent. A level of seven would indicate a high level of correctness that a binary one was sent and at the same time a very low level of correctness that a binary zero was sent. Most importantly, a level of three or four would indicate high uncertainty for either a binary zero or a binary one. Thus, levels of correctness of three or four typically indicate low quality bits. The 3 bit units outputted by the QPSK demodulator 44 are received by the automatic gain control (AGC) 48, which adjusts the gain of the amplifiers 40.

A Viterbi decoder 50 (inner decoder) receives the correctness-weighted data bits and performs conventional soft-decision Viterbi decoding. The first decoded output of the Viterbi 50 is passed to the de-interleaver 52, which may form Reed Solomon symbols by forming 8-bit groups from the Viterbi output, and which de-interleaves the output of the Viterbi decoder 50. When the de-interleaver is used to form the symbols for Reed Solomon decoding, the de-interleaver 52 may be considered part of the Reed Solomon decoding process. The output of the de-interleaver 52 flows to the Reed Solomon decoder 54 (outer decoder). The Reed Solomon decoder 54 performs Reed Solomon decoding without erasure and without referring to the correctness level of the data decoded by the Viterbi decoder 50. This feature is discussed in detail below. The Reed Solomon decoder 54 outputs decoded output data 56, which approximately equals the data input 10.

The conventional concatenated Viterbi and Reed Solomon decoder described above may be implemented with available hardware. For example, an L64704 satellite decoder, produced by LSI logic, may be used.

It has been observed by the present inventors that conventional concatenated convolutional and block decoders sometimes produce bursts of errors at the convolutional decoding stage when low quality bits occur in bursts or groups. Such bursts may occur randomly as a result of receiver noise, or they may occur regularly as a result of nearby pulse sources, such as pulse radar.

Viterbi decoding is accurate at correcting intermittent or interspersed corrupted bits. The value of a Viterbi output bit (a "hard" 1 or 0) depends in part on the quality measure of the H previous input bits, where H is the code history size. When a number of low quality bits appear sequentially or nearly sequentially, the Viterbi decoder generates output errors, usually without any indication of such error.

Reed Solomon decoding is well suited to correct these bursts of errors. Typically, bits are grouped into 8 bit symbols, groups of which form codewords. The codewords (or blocks) of 8 bit symbols contain redundancy data symbols, or parity symbols, which are used to correct a number of symbol errors equal to one-half the number of redundant, or parity, symbols (when erasure, discussed below, is not used). If any bit in a symbol is corrupted, then the entire symbol is corrupted. For example, if a Reed Solomon decoder is capable of correcting up to 10 symbol errors, and an error burst of 11 bit in error occurs, only 2 or 3 Reed Solomon symbols in a codeword might be in error, which the exemplary Reed Solomon decoder can easily correct. However, if the 11 bit errors were dispersed evenly throughout the code word, up to 11 symbols could be in error. The Reed Solomon decoder can correct no more than 10 symbol errors, and therefore the codeword containing the 11 bit/symbol errors would be in error or corrupt. That is to say, the Reed Solomon decoder could not correct the codeword.

With Reed Solomon decoders, if symbol errors are known before decoding, Reed Solomon decoding with erasure may be performed. With erasure, symbols in error are ignored. Error symbols may be ignored or erased because the Reed Solomon decoder decides which codeword was intended or sent based on the minimum distance between the received codeword and each of the set of possible matching codewords. This symbol difference count is sometimes referred to as the Hamming distance.

If L is defined to be the number of symbols in a codeword containing 1 or more bit errors, and S is defined to be the number of symbols erased from the codeword, then D, the number of parity symbols included with the codeword, is greater than or equal to two times L plus S. This relation may also be expressed by the formula number 2L+S<D. It can be seen that if all error symbols in a codeword could be identified and erased, twice as much interference duty cycle would be mitigated. In other words, if all symbols with errors were known and ignored (erased), then the distance to the correct Reed Solomon codeword would be 0. However, there is a limit on the number of erasures within a codeword; too many symbol erasures may lead to a Hamming distance of 0, resulting in the unacceptable possibility of matching multiple codewords. Thus, the correct codeword could not be accurately selected or determined.

In conventional concatenated Reed Solomon Viterbi decoders, Reed Solomon decoding with erasure is not used. Viterbi decoded output received by the Reed Solomon decoder does not include bit quality or correctness information. In previous systems there has been no readily apparent way to associate or identify error-prone groups of low quality bits received by the Viterbi decoder with low quality Reed Solomon symbols. Furthermore, if all Reed Solomon symbols containing bits corresponding to low quality Viterbi input bits are erased, system performance suffers, because many of those low quality bits (and corresponding symbols) would be corrected by the Viterbi decoder before they are received by the Reed Solomon decoder.

By predicting which Viterbi input bits are likely to fail to be corrected by the Viterbi decoder, we have made it is possible to perform Reed Solomon erasure on symbols containing or corresponding to those pre-identified Viterbi error-prone bits, thereby improving throughput and/or reducing the overall bit BER.

One aspect of the present invention An embodiment enables near optimum Reed Solomon decoding with erasure in concatenated Viterbi and Reed Solomon coding systems. Characteristics or parameters of low quality bit groupings that are likely to be erroneously Viterbi decoded are determined in advance. These characteristics are used to identify error patterns, information of which is used for Reed Solomon erasure. A process of determining these characteristics or parameters is discussed in detail further below, with reference to FIGS. 8-11.

When bursts of input noise occur, a string or sequence of input bits will have a high concentration of bits with a low correctness level or quality measure. When the noise pulse is long enough, there is a high probability that the Viterbi output will produce a corresponding error burst. Because, as discussed above, the convolutional or Viterbi decoder decodes an output bit based on a limited number of consecutive previous input bits (bit history H), a Viterbi error output is expected. Viterbi error correction fails when the Viterbi decoder is supplied with a string of consecutive, or nearly consecutive, low-quality bits. The length of a pulse of low quality bits that will have a high probability of erroneous Viterbi decoding depends on a number of factors, discussed further below with reference to FIGS. 8-11. Knowing such factors in advance, the Reed Solomon decoder can be notified when the Viterbi decoder is likely to break down due to a low-quality data burst.

The soft-decision bit quality data (correctness bits) already being supplied to the Viterbi decoder is processed in parallel by a detector, while or before being processed by the Viterbi decoder. This sliding window detector identifies bit quality patterns or groupings that are likely to result in Viterbi failure, and such identification is used by the Reed Solomon decoder to perform erasure on corresponding symbols likely to contain corresponding Viterbi errors.

Figure 3:
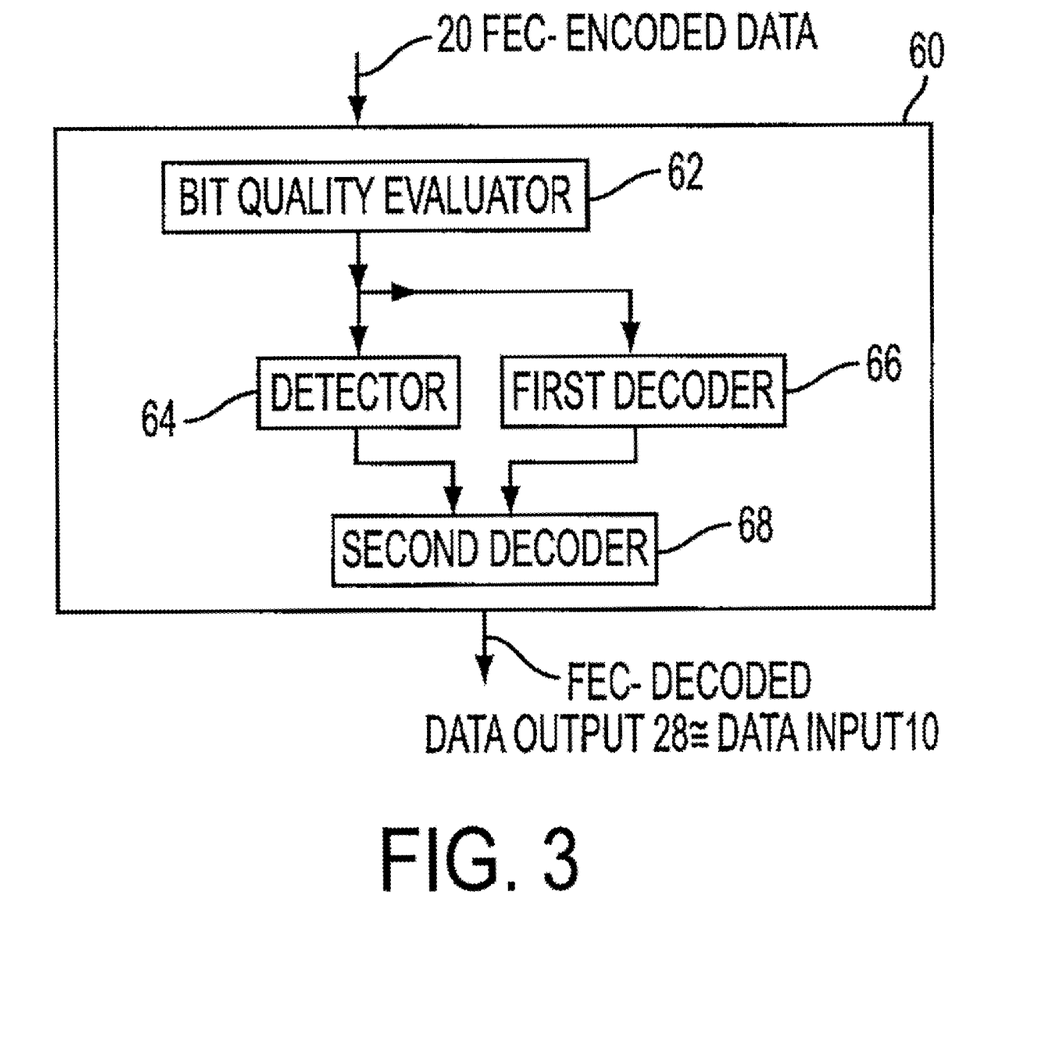
FIG. 3 illustrates a decoding unit 60 according to an embodiment.

FIG. 3 illustrates a decoding unit 60. FEC encoded data is received by the decoding unit 60. A bit quality evaluator 62 assigns a quality or correctness weighting to each input bit. The correctness-weighted data is processed by a detector 64 and a first decoder 66. A second decoder 68 decodes the output of the first decoder 66, based on or according to error identification information received by the detector 64. The second decoder 68 outputs FEC decoded data output 28, which is approximately equal to data input 10; the source data before being FEC encoded. In a preferred embodiment, a demodulator may serve as the bit quality evaluator, the first decoder 66 may be a convolutional or Viterbi decoder, the detector 64 may perform error detection on a sliding window of M of N bits, and the second decoder 68 may be a Reed Solomon decoder using erasure based on information provided by the detector 64.

Figure 4:
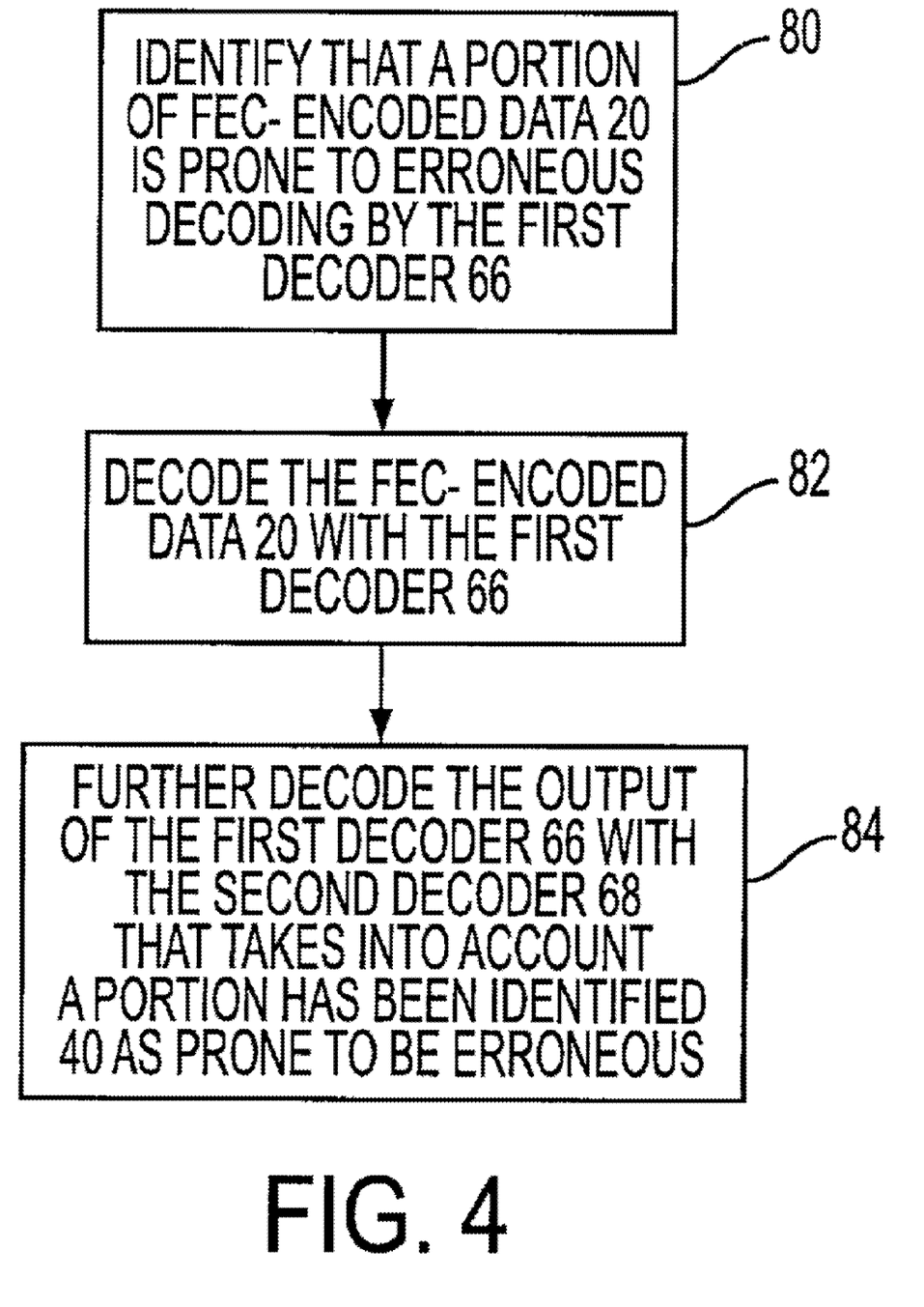
FIG. 4 illustrates a decoding process according to an embodiment.

FIG. 4 illustrates a decoding process carried out by the decoding unit 60. A portion of FEC encoded data 20 being evaluated by the bit quality evaluator 62 is identified 80 to be prone to erroneous decoding by the first decoder 66. The output of the first decoder 66 is further decoded 84 with the second decoder 68, by taking into account a portion of encoded data 20 that has been identified as prone to be erroneously decoded.

Figure 5:
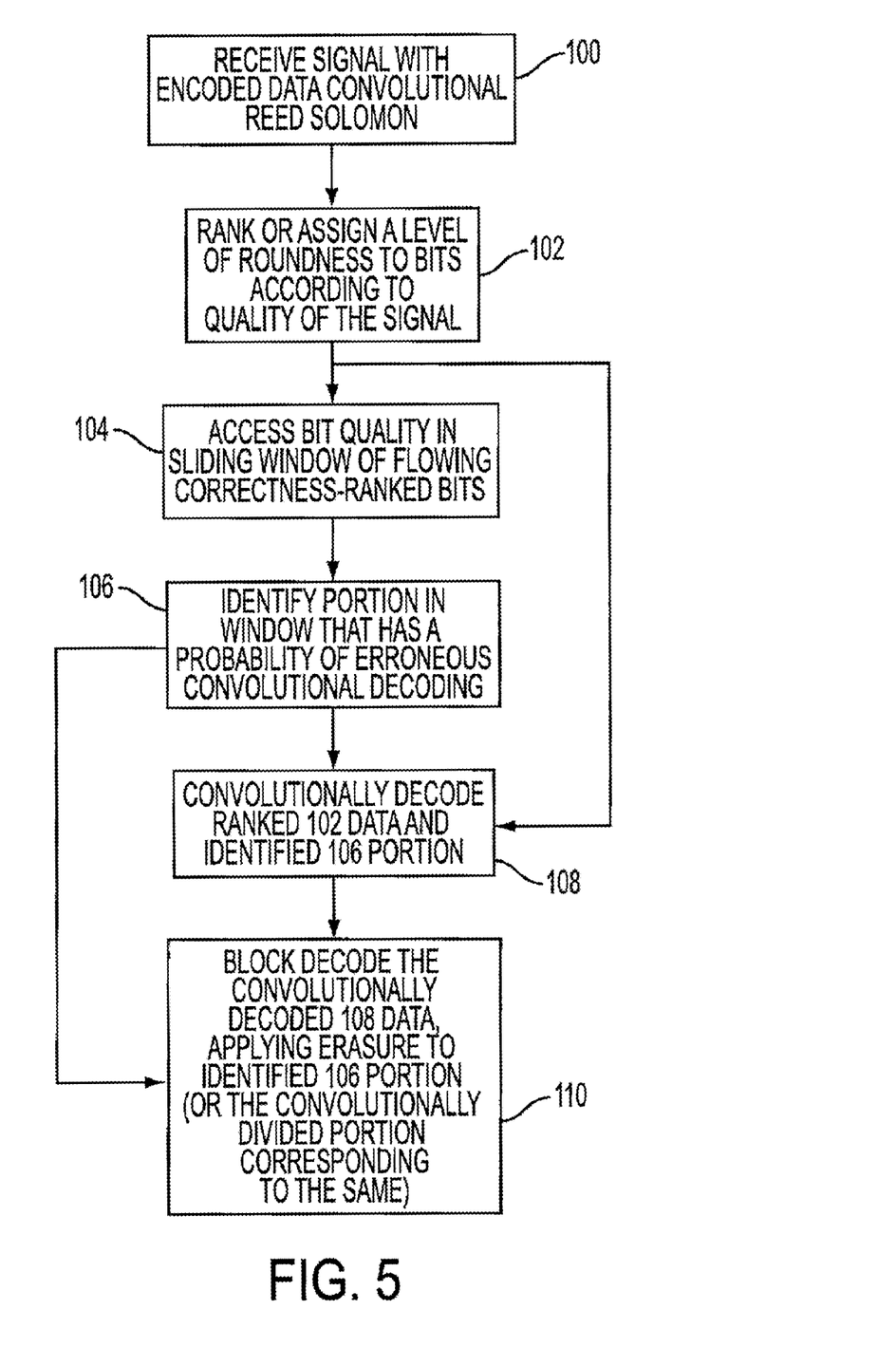
FIG. 5 illustrates a decoding process according to an embodiment.

FIG. 5 illustrates an embodiment of the process shown in FIG. 4. The decoding unit 60 receives 100 a signal with convolutional and Reed Solomon encoded data. A rank or level of correctness is assigned 102 to bits according to the quality of the signal. The quality rated bits are assessed 104 in the detector 64. A portion of quality ranked data in the decoder 64 or sliding window is identified 106 as having a probability of being erroneously convolutionally decoded by the first decoder 66. After or during the assessing 104 and the identifying 106, the quality ranked bit data generated by the assigning 102 is convolutionally decoded 108 by the first decoder 66. A portion of the data identified 106 is convolutionally decoded 108 along with the other quality ranked data. The convolutionally decoded data generated by the convolutional decoding 108 is block decoded by applying erasure to the identified portion (or the convolutionally decoded portion corresponding to the same).

Figure 6:
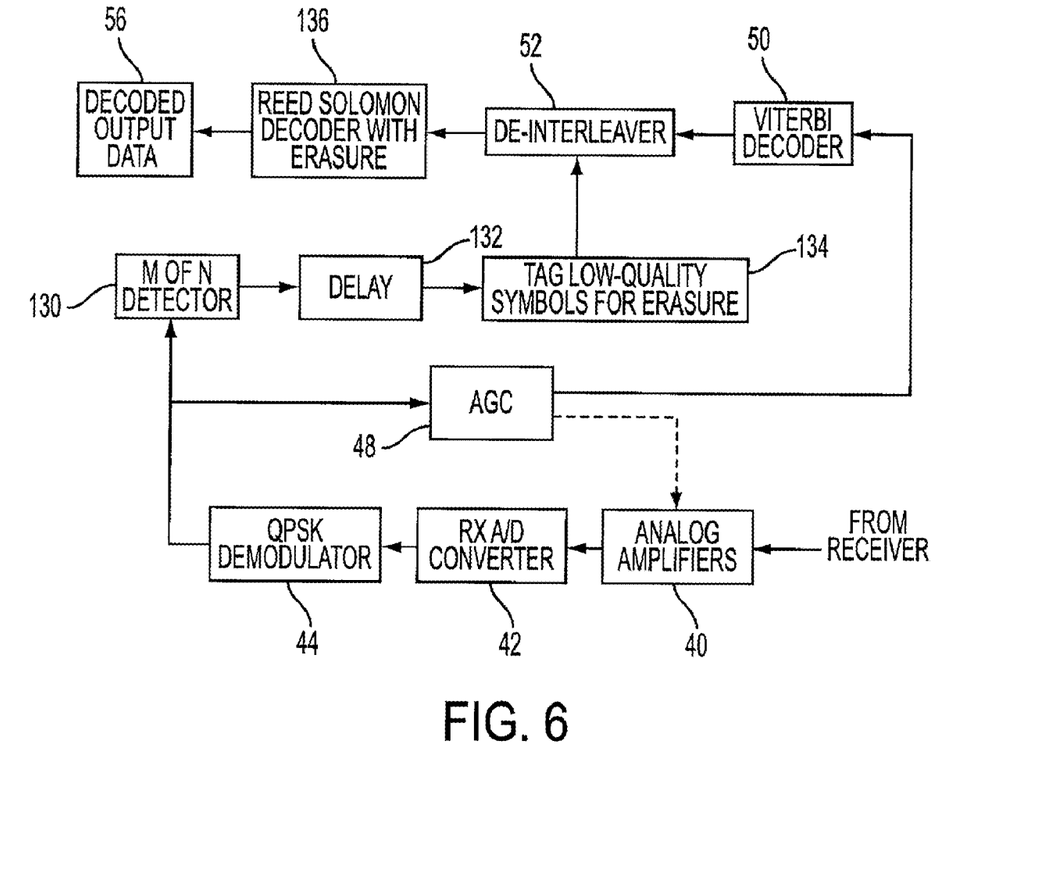
FIG. 6 illustrates an embodiment of a decoder according to an embodiment.

FIG. 6 illustrates an embodiment of a decoder of the present invention. Items 40-52, and 56 are discussed above with reference to FIG. 2. The relations and interactions between items 40-50 are essentially described above with reference to FIG. 2. In the detector shown in FIG. 6, the correctness-rated output of the QPSK demodulator 44 is received by both the input of the AGC 48 and the input of an M of N detector 130. The M of N detector 130 passes tagging information to a delay 132, and a tagging unit 134 receives the delayed tagging information from the delay 132. The delay 132 enables the output of the Viterbi decoder 50, delayed by such decoding, to catch up with and synchronize with the tagging information generated by the M of N detector 130. This synchronization enables the tagging unit 134 to tag symbols output by the Viterbi decoder 50 that correspond to bits determined by the M of N detector 130 to be in a group or burst of quality ranked bits that are likely to or have a probability of being incorrectly decoded by the Viterbi decoder 50.

A de-interleaver 52 receives the delayed tagging information from the tagging unit 134 and the first decoded output from the Viterbi decoder 50. Because Reed Solomon decoding with erasure is usually performed by erasing (ignoring) any symbol which contains a bit in error, the de-interleaver 52 marks for erasure any symbol to be input to the Reed Solomon decoder 136 which contains a bit output by the Viterbi output 50 and tagged by the tagging unit 134.

The Reed Solomon decoder 136 receives the tagged and untagged symbols from the de-interleaver 52 and performs Reed Solomon decoding with erasure. Generally, Reed Solomon decoding is performed on codeword units that are made up of a fixed number of symbols. Some of the symbols in a codeword represent data, and other symbols in a codeword contain parity information that is used to correct errors in the data symbols. Reed Solomon decoders generally decide which codeword is the correct codeword based on the minimum of the distances between the received codeword and each of the set of possible matching codewords. Therefore, by enabling concatenated Viterbi soft-decision decoding and Reed Solomon soft-decision decoding, the present invention can correct twice as many symbol errors as a concatenated decoder using Reed Solomon hard decision decoding (decoding without erasure).

Although the M of N detector 130 has been described with reference to a fixed-length sliding window, other configurations may also be used. For example, the parameters of the M of N detector 130 may be dynamically set based on conditions within the decoding unit 60. The operations of the M of N detector 130 may also be externally configurable or programmable. Furthermore, the delay 132, the tagging unit 134, and the de-interleaver 52, may be arranged in various configurations, or may not be required depending on the other components of the decoding unit 60. Any number of hardware or software arrangements may be used to enable Reed Solomon soft-decision decoding with erasure based on predictable patterns of Viterbi decoding errors. Furthermore, although Viterbi decoding failure-prediction has been described with reference to a ratio or concentration of low quality bits within a sliding window (M out of N), other tests or algorithms may be used to identify in advance patterns or sequences of error prone quality ranked bits that are to be decoded by a Viterbi decoder 50.

Figure 7:
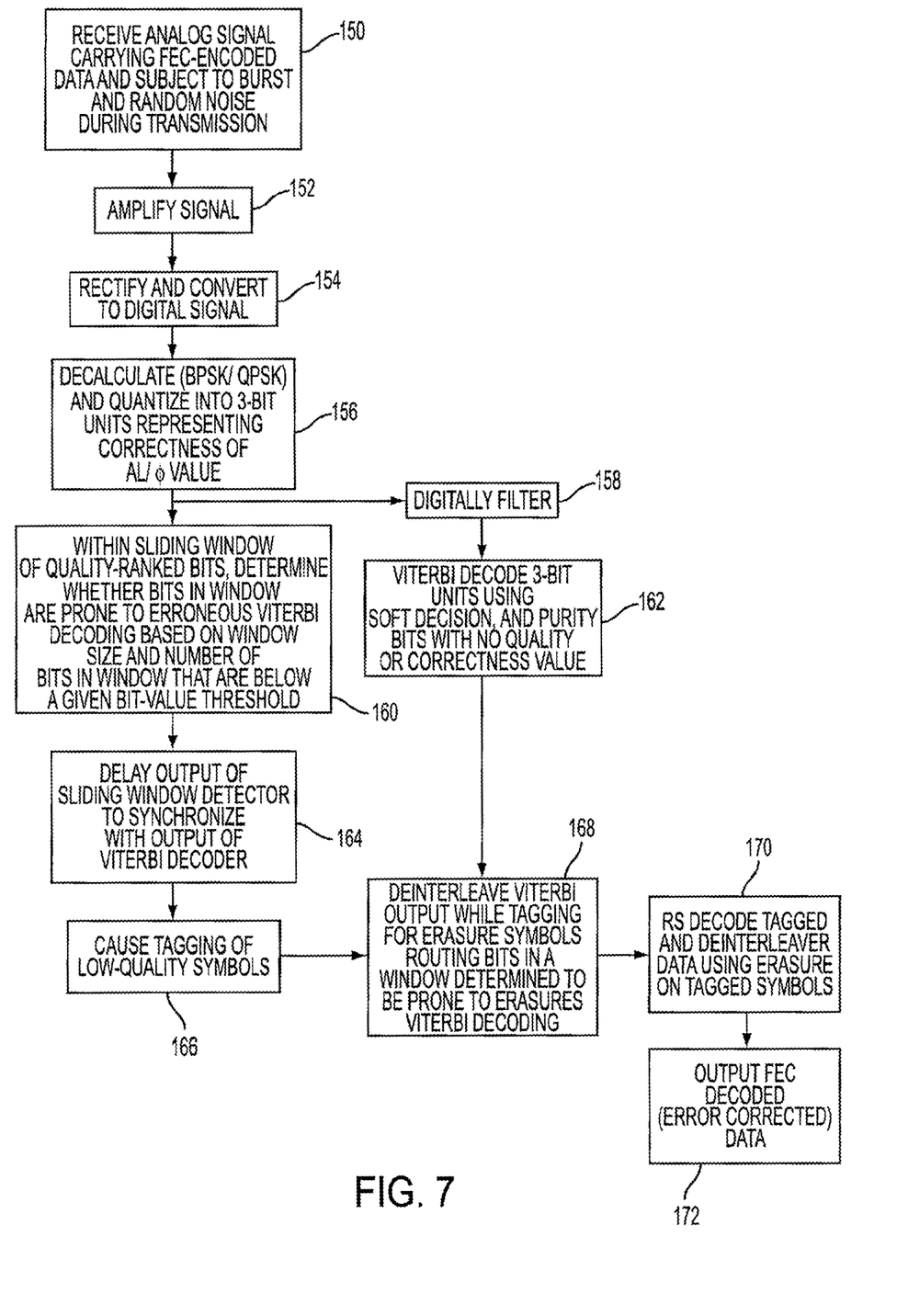
FIG. 7 illustrates an embodiment of a process according to an embodiment.

FIG. 7 illustrates an embodiment of a process of the present invention according to an embodiment. An analog signal carrying FEC decoded data that has been subject to burst and/or random noise during transmission is received 150. The signal is amplified 152 and converted 154 to a digital signal. The digital signal is demodulated 156, using, for example, binary or quadrature phase shift keying, and is quantized into 3 bit units representing the correctness of a 1 or 0 data value. The quantized or correctness ranked digital data is channeled to two different parallel processing paths. In a first path, within a sliding window of the quality ranked bits, it is determined 160 whether bits in the window are prone to erroneous Viterbi decoding. This determination may be based on the size of the window (e.g., the number of bits in the window), and also on the number or concentration (M/N) of bits in the window at a given time that have a quality level below a given bit quality threshold. The bit stream, including the bits (or corresponding bits) detected or determined 160 to be prone to erroneous Viterbi decoding, are delayed 164 and tagged 166.

In the second parallel quantized bit processing path, the quantized or quality ranked bits are digitally filtered 158 and Viterbi decoded 162 using soft-decision decoding according to the correctness of individual data bits as indicated by the 3 bit units. Generally, the Viterbi soft-decision decoding 162 consumes or does not output the quality ranking, and outputs hard (unranked) Viterbi decoded bits, which have no inherent quality or correctness value or rating.

The bits output by the Viterbi decoding 162 that correspond to bits determined 160 to be prone to erroneous Viterbi decoding are tagged for erasure 168. The Viterbi decoded 162 output, including the bits tagged for erasure 168, are Reed Solomon soft-decision decoded 170 by erasing symbols that contain tagged bits. Accordingly, the second-decoded output of the Reed Solomon decoding 170 has been error corrected.

Figure 8:
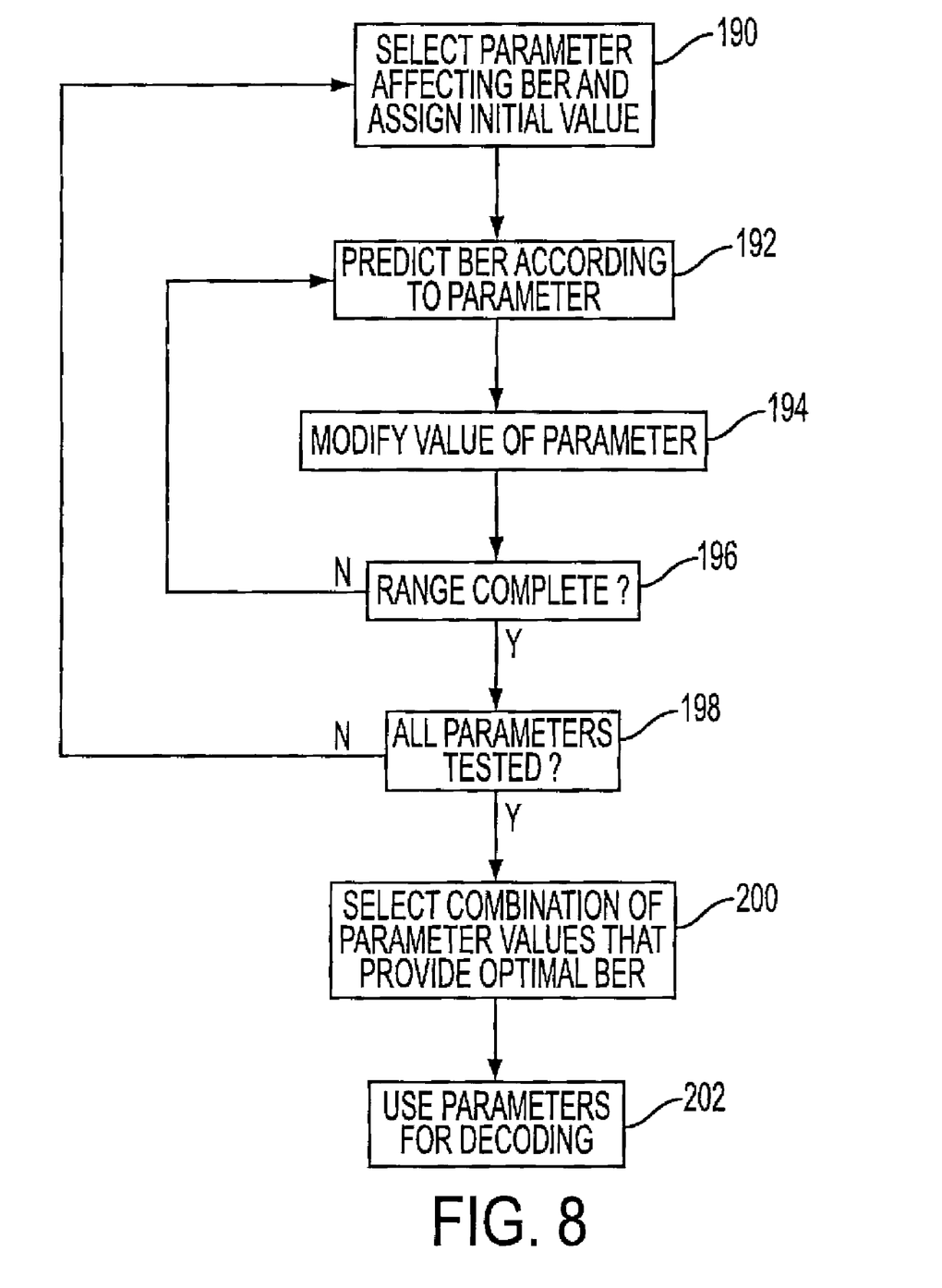
FIG. 8 illustrates a process by which operating parameters of an M of N detector may be determined according to an embodiment.

FIG. 8 illustrates a process by which operating parameters of the M of N detector 130 may be determined. The operating parameters of the detector 130 may include, for example, the size of the sliding window (N), the number of low quality bits (M) which indicate a maximum portion of the window that is allowed to contain low-quality ranked bits before bits in that window (some or all) should be tagged for erasure, and a quality or correctness threshold level parameter which the M bits fall below. Initially, a parameter affecting the BER of the decoding unit 60, is selected and assigned 190 an initial value. The initial value of the selected parameter is used to predict 192 the bit error rate. The value of the selected parameter is modified 194 and the predicting 192 and modifying 194 is repeated until predicted bit error rates over a range of values of the parameter is completed 196. This process is performed until various parameters affecting the BER have been tested 198. The parameter values that resulted in an optimal predicted BER are selected 200 and used 202 for decoding.

Other patterns, configurations, or distributions of low-quality bits in the window may also be used to trigger tagging. For example, bit-quality groupings may be used (e.g. 4 medium quality bits, and 2 low-quality bits). Statistical distributions may be used. Patterns or arrangements may also be used to detect error-prone portions.

Figure 9:
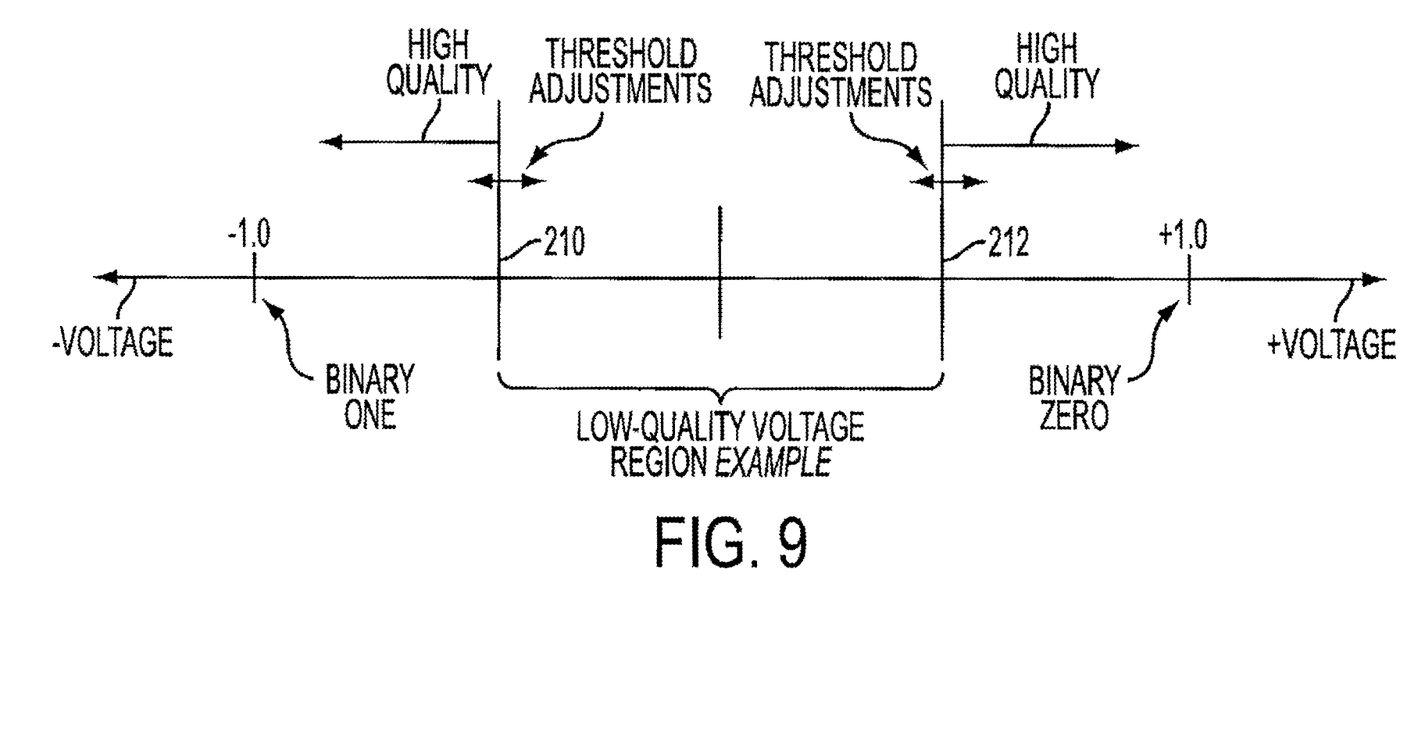
FIG. 9 illustrates bit quality thresholds according to an embodiment.

FIG. 9 illustrates bit quality thresholds 210 and 212. The thresholds 210 and 212 are used to determine the M number of low quality bits within a given window. The process for deriving prediction parameters (moving them along the axis), discussed above with reference to FIG. 8, may be used to determine the voltage thresholds 210 and 212.

Figure 11:
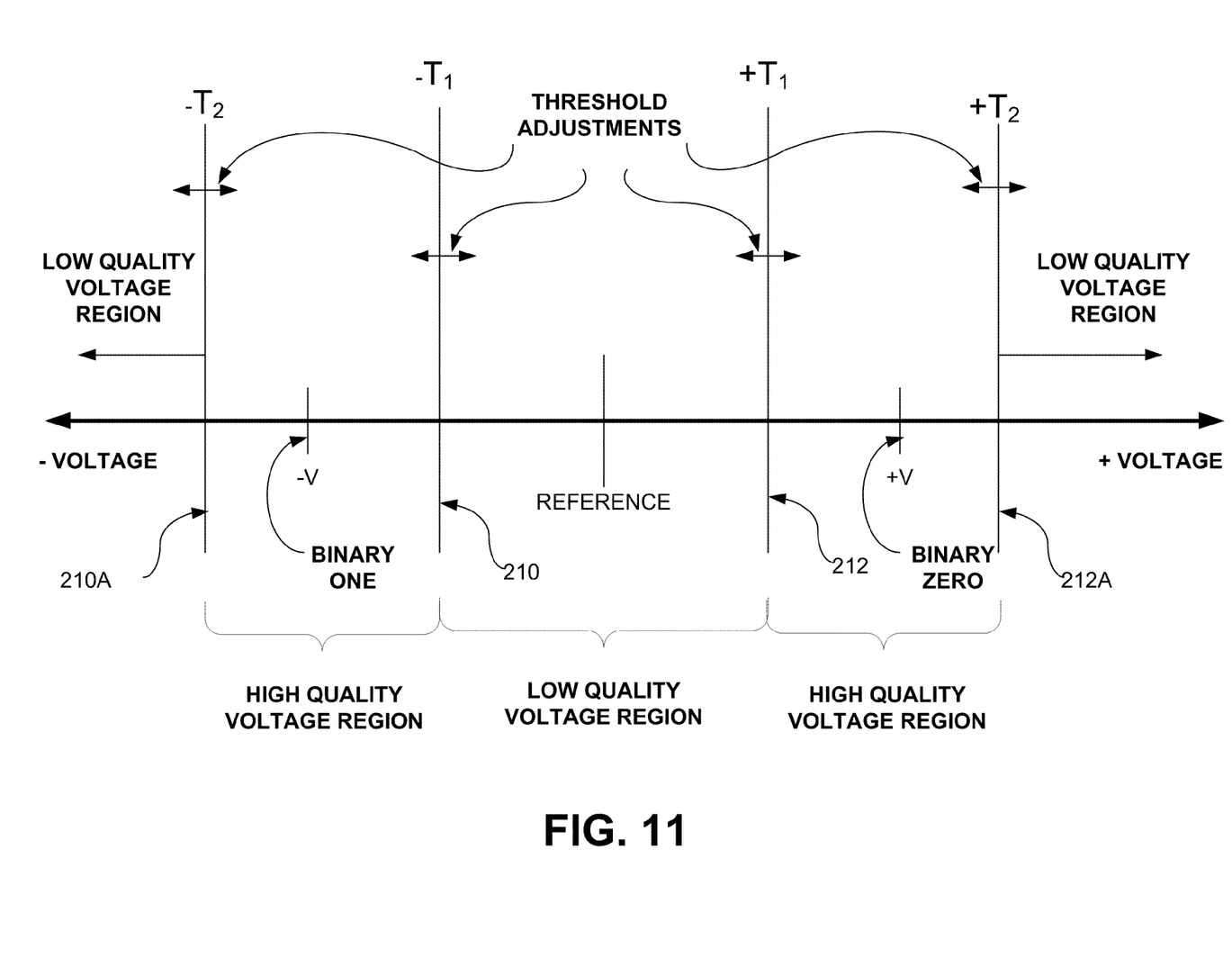
FIG. 11 illustrates enhanced bit quality thresholds according to an embodiment.

FIG. 11 illustrates another embodiment in which bit quality voltage thresholds 210 and 212 are extended to include bit quality voltage thresholds 210A and 212A. Bit quality voltage thresholds 210A and 212A establish an upper bound for a binary one and a binary zero bit. By way of illustration and not as limitation, the binary one is −1V and the binary zero is +1V.

By way of illustration and not as a limitation, extended FEC (EFEC) is used in a TV-DTS receiver. The receiver receives a QPSK signal that is first filtered and split into two binary PSK signals, each feeding an A/D converter. Each voltage output sample of an A/D circuit is binned into one of eight values represented by three bits (herein, a "3-bit" value). In this embodiment, (1,1,1) represents a "7," (1,1,0) a "6" and down to (0,0,0) a "zero." The 3-bit value 7 (1,1,1) is assigned if the magnitude of the received voltage is greater than a low quality voltage region threshold bounded by threshold adjustments 210 but less than the low quality voltage region threshold defined by threshold adjustment 210A. The 3-bit value 0 (0,0,0) is assigned if the magnitude of the received voltage is greater than a low quality voltage region threshold bounded by threshold adjustments 212 but less than the low quality voltage region threshold defined by threshold adjustment 212A. Voltages of magnitudes equal to or above the threshold adjustments 210A and 212A are identified as low quality bits.

In an embodiment, the identification of voltages of magnitudes equal to or above the threshold adjustments 210A and 212A as low quality bits is achieved by assigning the voltage output sample a 3-bit representation associated with a low quality bit, such as 3-bit representation associated with the region between threshold adjustments 210 and 212.

In another embodiment, the voltage output sample of an A/D circuit is binned into one of sixteen values (0-15) (a "4-bit" value). In this embodiment, the low quality bits determined by threshold adjustments 210A and 212A are assigned unique 4-bit values.

The definition of poor quality regions on either side of binary one and binary zero is a departure from current practice. According to the current art, the normal noise statistics are such that excursions from the binary one (when a one was sent) or excursions from the binary zero (when a zero was sent) are designed to be rarely occurring. Thus, the probability that a binary one was sent when the voltage is less than −V is considered by theorists to be essentially unity and according to the current art is labeled "high quality." In the embodiment illustrated in FIG. 11, the prevailing approach has been rejected. Rather, in this embodiment, a departure from "−V" on either side by more than a predetermined measure (for example, two standard deviations), is such a low probability event that bits in this region are labeled "low quality." System performance has borne out the efficacy of this approach.

Figure 10:
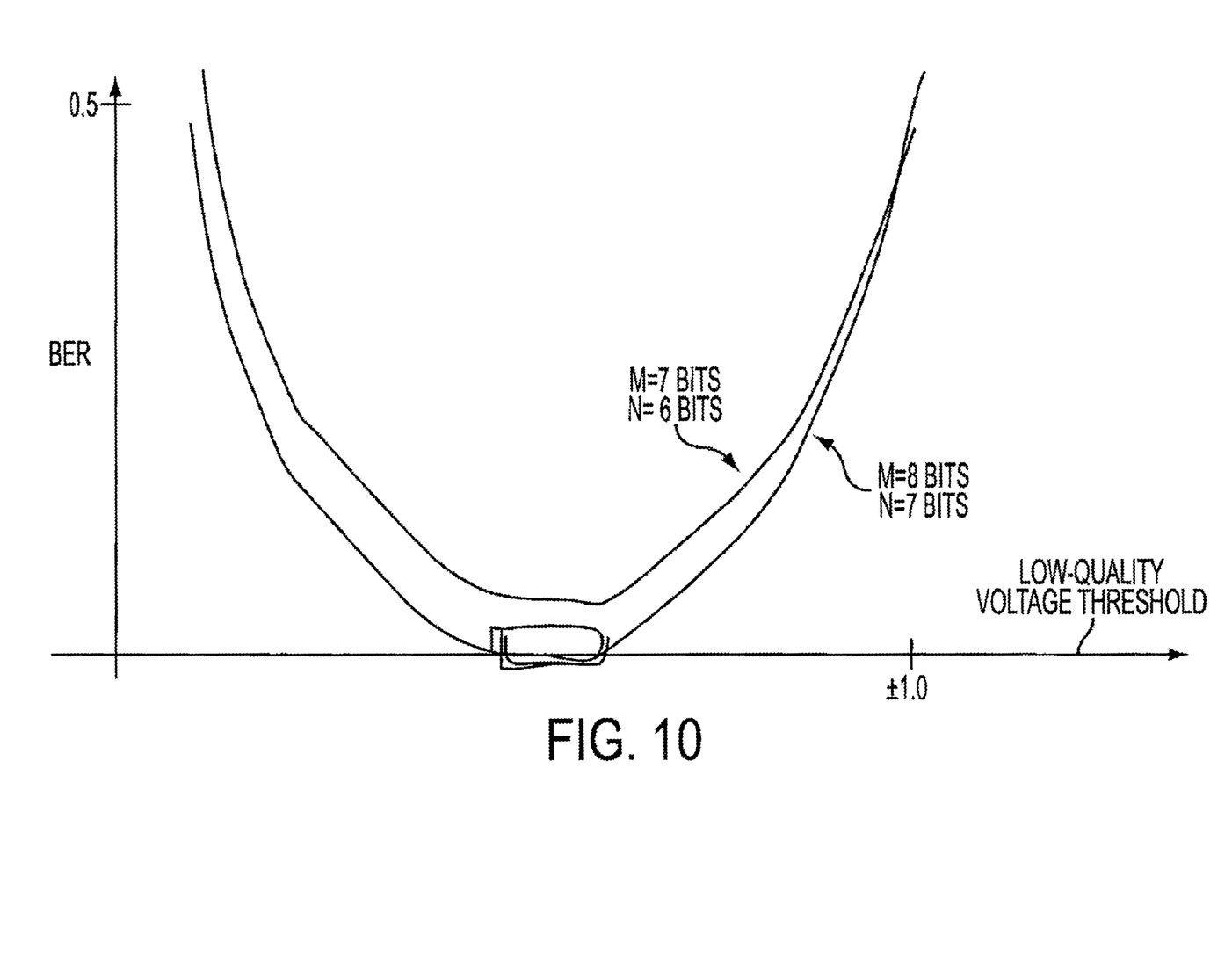
FIG. 10 illustrates a process for predicting bit error rates based on different M, N, and low-quality voltage threshold according to an embodiment.

FIG. 10 illustrates an example of bit error rate predictions based on different M, N, and low quality voltage threshold values. In the example of FIG. 10, the M=8, N=7 curve carries the lowest bit error rate, and M=8 and N=7 would be used as sliding window parameters in accordance with a corresponding low quality voltage threshold.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A method of ranking bits in a data stream comprising:
at a bit quality evaluator,
defining a binary one bit as a first voltage −V relative to reference voltage and a binary zero bit as a second voltage +V relative to the reference voltage;
defining a first low quality region between a first threshold voltage $-T_1$ and a second threshold voltage $+T_1$, wherein the absolute value of $-T_1$ is less than the absolute value of −V by a first predetermine amount and the second threshold is less than +V by the first predetermined amount;
defining a second low quality region relative to a third threshold voltage $-T_2$, wherein the absolute value of $-T_2$ is greater than the absolute value of −V by a second predetermine amount;
defining a third low quality region relative to a fourth threshold voltage $+T_2$, wherein $+T_2$ is greater than +V by the second predetermine amount;
defining a first high quality region as between and including $-T_1$ and $-T_2$ and a second high quality region as between and including $+T_1$ and $+T_2$;
identifying a bit as a poor quality bit if its voltage is within a quality region selected from the group consisting of the first low quality region, the second low quality region, and the third low quality region;
tagging the poor quality bits with tagging data, and
sending the data stream and the tagging data to an error detector and a first decoder; at the first decoder,
receiving the data stream and tagging data,
decoding the data stream, and
sending the decoded data stream to a second decoder; at the error detector,
determining whether a concentration of poor quality bits within a sliding window of bits in the data stream exceeds a concentration threshold based on the tagging data,
predicting that the first decoder will fail to correct errors when the concentration of poor quality bits within the sliding window exceeds the concentration threshold, and
instructing the second decoder to perform erasure on symbols likely to contain errors based on the tagging data; and
at the second decoder, outputting decoded corrected data.

2. The method of claim 1, wherein the reference voltage is zero, the first voltage −V is −1.0 volts, and the second voltage +V is +1.0 volts.

3. The method of claim 1, wherein the second decoder is a Reed Solomon decoder.

4. The method of claim 1, wherein the quality of the bits in the data stream is based on a quality of a received transmission signal from which the bits are derived.

5. The method of claim 1, wherein the first decoder comprises a Viterbi decoder.

6. The method of claim 5, wherein the sliding window precedes decoding by the Viterbi decoder.

7. The method according to claim 1, wherein the concentration is expressed as M out of N, where N is a number of bits comprising a sequence of bits in the data stream, and M is a count of bits, in the sequence, that have a quality below the quality threshold.

8. The method of claim 7, wherein N is a fixed number and corresponds to bit width of the sliding window.

9. The method of claim 7, wherein N is dynamically set based on conditions within the first decoder.

10. A method of ranking bits in a data stream comprising:
at a bit quality evaluator,
defining a binary one bit as a first voltage −V relative to reference voltage and a binary zero bit as a second voltage +V relative to the reference voltage;
defining a first low quality region between a first threshold voltage $-T_1$ and a second threshold voltage $+T_1$, wherein the absolute value of $-T_1$ is less than the absolute value of −V by a first predetermine amount and the second threshold is less than +V by the first predetermined amount;
defining a second low quality region relative to a third threshold voltage $-T_2$, wherein the absolute value of $-T_2$ is greater than the absolute value of −V by a second predetermine amount;
defining a third low quality region relative to a fourth threshold voltage $+T_2$, wherein $+T_2$ is greater than +V by the second predetermine amount;
defining a first high quality region as between and including $-T_1$ and $-T_2$ and a second high quality region as between and including $+T_1$ and $+T_2$;
identifying a bit as a poor quality bit if its voltage is within a quality region selected from the group consisting of the first low quality region, the second low quality region, and the third low quality region;
tagging the poor quality bits with tagging data, and
sending the data stream and the tagging data to an error detector and a Viterbi decoder;
at the Viterbi decoder,
receiving the data stream and tagging data,
decoding the data stream, and
sending the decoded data stream to a Reed-Solomon decoder;
at the error detector,
determining whether a concentration of poor quality bits within a sliding window of bits in the data stream exceeds a concentration threshold based on the tagging data,
predicting that the Viterbi decoder will fail to correct errors when the concentration of poor quality bits within the sliding window exceeds the concentration threshold, and
instructing the Reed-Solomon decoder to perform erasure on symbols likely to contain errors based on the tagging data; and
at the Reed-Solomon decoder, outputting decoded corrected data.

11. The method of claim 10, wherein the reference voltage is zero, the first voltage −V is −1.0 volts, and the second voltage +V is +1.0 volts.

12. The method according to claim 10, wherein the concentration is expressed as M out of N, where N is a number of bits comprising a sequence of bits in the data stream, and M is a count of bits, in the sequence, that have a quality below the quality threshold.

13. The method of predicting of claim 12, wherein N is a fixed number and corresponds to bit width of the sliding window.

14. The method of predicting of claim 12, wherein N is dynamically set based on conditions within the Viterbi decoder.

15. The method of claim 12, wherein the quality of the bits in the data stream is based on a quality of a received transmission signal from which the bits are derived.

* * * * *